(12) United States Patent
Imanaka et al.

(10) Patent No.: US 12,049,156 B2
(45) Date of Patent: Jul. 30, 2024

(54) MANAGEMENT APPARATUS, MANAGEMENT METHOD, AND VEHICLE

(71) Applicant: GS Yuasa International Ltd., Kyoto (JP)

(72) Inventors: Yuki Imanaka, Kyoto (JP); Satoru Narimoto, Kyoto (JP)

(73) Assignee: GS YUASA INTERNATIONAL LTD., Kyoto (JP)

(\*) Notice: Subject to any disclaimer, the term of this patent is extended or adjusted under 35 U.S.C. 154(b) by 602 days.

(21) Appl. No.: 17/291,926

(22) PCT Filed: Nov. 7, 2019

(86) PCT No.: PCT/JP2019/043636
§ 371 (c)(1),
(2) Date: May 6, 2021

(87) PCT Pub. No.: WO2020/100707
PCT Pub. Date: May 22, 2020

(65) Prior Publication Data
US 2022/0009377 A1 Jan. 13, 2022

(30) Foreign Application Priority Data

Nov. 16, 2018 (JP) ................. 2018-215400

(51) Int. Cl.
*B60L 58/25* (2019.01)
*B60L 58/12* (2019.01)
*B60W 20/20* (2016.01)
*H01M 10/48* (2006.01)

(52) U.S. Cl.
CPC ............... *B60L 58/25* (2019.02); *B60L 58/12* (2019.02); *B60W 20/20* (2013.01); *H01M 10/48* (2013.01)

(58) Field of Classification Search
CPC ......... B60L 58/25; B60L 58/12; B60W 20/20; H01M 10/48; H01M 2010/4271;
(Continued)

(56) References Cited

U.S. PATENT DOCUMENTS

| 8,008,891 | B2* | 8/2011 | Yun | ......................... B60L 58/15 320/132 |
| 8,830,676 | B2* | 9/2014 | Borck | ............... H01M 10/6553 429/96 |

(Continued)

FOREIGN PATENT DOCUMENTS

| JP | H06-031304 U | 4/1994 |
| JP | 2011-112453 A | 6/2011 |

(Continued)

OTHER PUBLICATIONS

English Translation of the Written Opinion of the International Search Authority for PCT/JP2019/043636; date of mailing Dec. 24, 2019. (Year: 2019).*

(Continued)

*Primary Examiner* — Calvin Cheung
(74) *Attorney, Agent, or Firm* — MCGINN I.P. LAW GROUP, PLLC

(57) ABSTRACT

A management apparatus for an energy storage device, which performs current measurement processing for measuring a current of the energy storage device by using a measuring resistor having one side connected to the energy storage device and the other side connected to an external terminal, temperature measurement processing for measuring at least one of a temperature of the energy storage device and a temperature of the external terminal, and correction processing for correcting, when there is a temperature difference between the temperature of the energy storage device and the temperature of the external terminal, a measurement error caused by the temperature difference for (Continued)

a measured current value measured by the current measurement processing, or guarantee processing for guaranteeing a function to be performed in accordance with a measured current value measured by the current measurement processing.

9 Claims, 12 Drawing Sheets

(58) Field of Classification Search
CPC .......... H01M 2220/20; H01M 10/486; H01M 10/425; H02J 7/0048; H02J 7/0047; Y02T 10/70; Y02E 60/10; G01R 31/374; G01R 31/3828

See application file for complete search history.

(56) References Cited

U.S. PATENT DOCUMENTS

| | | | | |
|---|---|---|---|---|
| 10,855,095 | B2* | 12/2020 | Marsili | ................ G01R 31/389 |
| 2017/0010331 | A1 | 1/2017 | Mano et al. | |
| 2019/0165433 | A1 | 5/2019 | Shiraishi et al. | |
| 2019/0204367 | A1 | 7/2019 | Frenzel et al. | |
| 2020/0088149 | A1 | 3/2020 | Okachi | |

FOREIGN PATENT DOCUMENTS

| | | |
|---|---|---|
| JP | 2012-217276 A | 11/2012 |
| JP | 2017-020890 A | 1/2017 |
| JP | 2017-049229 A | 3/2017 |
| JP | 2017-514115 A | 6/2017 |
| JP | 2019-138706 A | 8/2019 |
| WO | WO 2018/008714 A1 | 1/2018 |
| WO | WO 2018/181489 A1 | 10/2018 |
| WO | WO 2018/199222 A1 | 11/2018 |

OTHER PUBLICATIONS

English Translation of the WO 2018199222 A1. (Year: 2018).*
International Search Report (ISR) (PCT Form PCT/ISA/210), in PCT/JP2019/043636, dated Dec. 24, 2019.

* cited by examiner

MANAGEMENT APPARATUS, MANAGEMENT METHOD, AND VEHICLE

TECHNICAL FIELD

The present invention relates to a method for measuring a current and a state of charge (SOC) of an energy storage device.

BACKGROUND ART

One of the methods for measuring the current of the energy storage device is a method using a measuring resistor such as a shunt resistor. The measuring resistor generates a voltage corresponding to the current, and hence the current can be measured by measuring the voltage.

When there is a temperature difference between both ends of the measuring resistor, a voltage is generated at both ends of the measuring resistor by the Seebeck effect. Patent Document 1 describes that, since a temperature difference is generated between both ends of a resistor having generated heat, the temperatures at both ends of the resistor are detected to correct a current value.

PRIOR ART DOCUMENT

Patent Document

Patent Document 1: JP-A-2017-514115

SUMMARY OF THE INVENTION

Problems to be Solved by the Invention

When the measuring resistor is connected between the energy storage device and an external terminal, one side connected to the energy storage device is influenced by the temperature of the energy storage device, and the other side connected to the external terminal is influenced by the temperature of the external terminal. When there is a temperature difference between the temperature of the energy storage device and the temperature of the external terminal, a voltage is generated at both ends of the measuring resistor due to the Seebeck effect, so that the measurement accuracy of the current and the SOC estimation accuracy decrease.

An object of the present invention is to suppress a current measurement error and a SOC estimation error caused by a temperature difference between a temperature of an energy storage device and a temperature of an external terminal.

Means for Solving the Problems

A management apparatus for an energy storage device, which performs current measurement processing for measuring a current of the energy storage device by using a measuring resistor having one side connected to the energy storage device and the other side connected to an external terminal, temperature measurement processing for measuring at least one of a temperature of the energy storage device and a temperature of the external terminal, and correction processing for correcting, when there is a temperature difference between the temperature of the energy storage device and the temperature of the external terminal, a measurement error caused by the temperature difference for a measured current value measured by the current measurement processing, or guarantee processing for guaranteeing a function to be performed in accordance with a measured current value measured by the current measurement processing.

The present technique can be applied to a management method for an energy storage device, an energy storage apparatus, a management program, a recording medium in which the management program is recorded, and a vehicle.

Advantages of the Invention

It is possible to suppress the current measurement error and the SOC estimation error caused by the temperature difference between the temperature of the energy storage device and the temperature of the external terminal.

MODE FOR CARRYING OUT THE INVENTION

Figure 1:
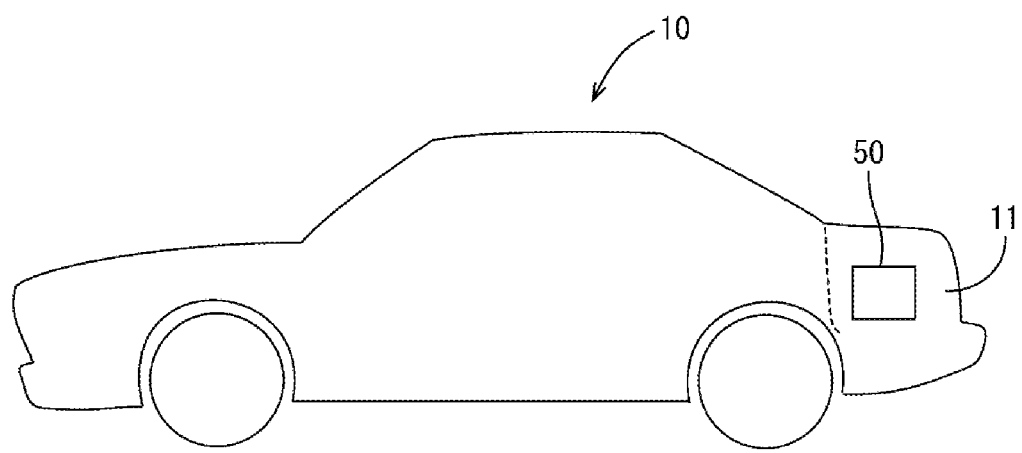
FIG. 1 is a side view of a vehicle in a first embodiment.

As a result of intensive studies on improving the current measurement accuracy and the SOC estimation accuracy of an energy storage device, the inventors have found that a current measurement error and an SOC estimation error may occur depending on a temperature difference between the temperature of the energy storage device and the temperature of an external terminal.

A management apparatus for an energy storage device, which performs current measurement processing for measuring a current of the energy storage device by using a measuring resistor having one side connected to the energy storage device and the other side connected to an external terminal, temperature measurement processing for measuring at least one of a temperature of the energy storage device and a temperature of the external terminal, and correction processing for correcting, when there is a temperature difference between the temperature of the energy storage device and the temperature of the external terminal, a measurement error caused by the temperature difference for a measured current value measured by the current measurement processing, or guarantee processing for guaranteeing a function to be performed in accordance with a measured current value measured by the current measurement processing.

Until now, it has not been recognized as a problem that a current measurement error and an estimation error of SOC occur due to a temperature difference between the temperature of the energy storage device and the temperature of the external terminal. When there is a temperature difference between the temperature of the energy storage device and the temperature of the external terminal, the management apparatus performs correction processing for correcting a measurement error caused by the temperature difference on the measured current value. It is possible to suppress the measurement error of the measured current value caused by the temperature difference between the temperature of the energy storage device and the temperature of the external terminal, for which no countermeasure has been taken so far. Hence the current measurement accuracy can be improved. The same applies to the SOC estimation accuracy. Further, by suppressing the measurement error of the measured current value, an erroneous operation due to the measurement error can be avoided, and a function executed in accordance with the measured current value can be guaranteed.

The function may be a function of integrating the measured current value to calculate a state of charge (SOC) of the energy storage device, and the change processing may be processing for correcting an estimation error caused by the temperature difference with respect to the SOC of the energy storage device.

When a measurement error caused by a temperature difference occurs with respect to the measured current value, an error also occurs in the SOC estimation accuracy calculated based on the integrated value of the current with respect to time. Therefore, the measurement error of the measured current value is corrected by the correction processing to improve the measurement accuracy, so that the SOC estimation accuracy can be improved.

The current measurement processing may include a first mode for measuring the measured current value at a predetermined cycle, and a second mode for measuring the measured current value at a cycle longer than the predetermined cycle. The function may be a function of transferring the mode from the second mode to the first mode when the current measurement processing measures a current value equal to or larger than a predetermined measured current value. The change processing may be processing for correcting a measurement error caused by the temperature difference with respect to the measured current value to avoid mode transfer due to a measurement error.

When the temperature difference between the temperature of the energy storage device and the temperature of the external terminal is large, it is determined that a voltage is generated at both ends of the measuring resistor by the Seebeck effect, and it is determined in the current measurement processing that a current is flowing. When a current value equal to or larger than a predetermined measured current value is measured due to a measurement error, the mode is shifted from the second mode to the first mode, and the measured current value is measured at a predetermined cycle. Therefore, the measurement error of the measured current value is corrected by the guarantee processing, so that it is possible to prevent an erroneous determination that the current is flowing in the current measurement processing and to avoid the mode shift due to the measurement error.

The function may be a function of diagnosing a vehicle failure when the current value equal to or larger than the predetermined current value is measured in the current measurement processing, and the change processing is processing for correcting a measurement error caused by the temperature difference with respect to the measured current value to avoid misdiagnosis of the vehicle failure due to the measurement error.

When the temperature difference between the temperature of the energy storage device and the temperature of the external terminal is large, it is determined that a voltage is generated at both ends of the measuring resistor by the Seebeck effect, and it is determined in the current measurement processing that a current is flowing. When the current value equal to or larger than the predetermined measured current value is measured by the measurement error, a diagnosis of a vehicle failure is executed. Therefore, the measurement error of the measured current value is corrected by the guarantee processing, so that it is possible to prevent erroneous determination that the current is flowing in the current measurement processing and to avoid the erroneous diagnosis of the vehicle failure due to the measurement error.

The correction processing may be executed when the measured current value of the energy storage device is smaller than a predetermined value.

The current measurement error caused by the temperature difference between the temperature of the energy storage device and the temperature of the external terminal has a larger influence as the measured current value is smaller when the temperature difference is the same. The ratio of the measurement error to the measured current value increases, thus causing a decrease in current measurement accuracy. Since the management apparatus executes the correction processing when the current value of the energy storage device is smaller than a predetermined value, the current measurement accuracy can be improved. The same applies to the SOC estimation accuracy.

Based on a measured temperature value measured by the temperature measurement processing, calculation processing may be performed for calculating a correction value for correcting the measurement error of the measured current value caused by the temperature difference between the temperature of the energy storage device and the temperature of the external terminal, or a correction value for correcting the estimation error of the SOC. In the correction processing, the measured current value may be corrected based on the correction value, or the SOC is corrected based on the correction value.

Since the management apparatus calculates the correction value for correcting the measurement error of the measured current value caused by the temperature difference between the temperature of the energy storage device and the temperature of the external terminal based on the measured temperature value measured by the temperature measurement processing, it is possible to correct the correction value with higher accuracy than when the measured current value is corrected using the correction value as a fixed value. The same applies to the case of correcting the SOC.

In the temperature measurement processing, the temperature of the energy storage device may be measured, and in the calculation processing, the correction value of the measured current value or the correction value of the SOC is calculated based on a temperature change rate of the energy storage device.

The temperature of the energy storage device can be measured using the normal monitoring function of the management apparatus. Since the temperature change rate of the energy storage device can be obtained from the measured temperature value of the energy storage device, the management apparatus can calculate the correction value without adding a new temperature sensor.

First Embodiment

1. Description of Battery

Figure 2:
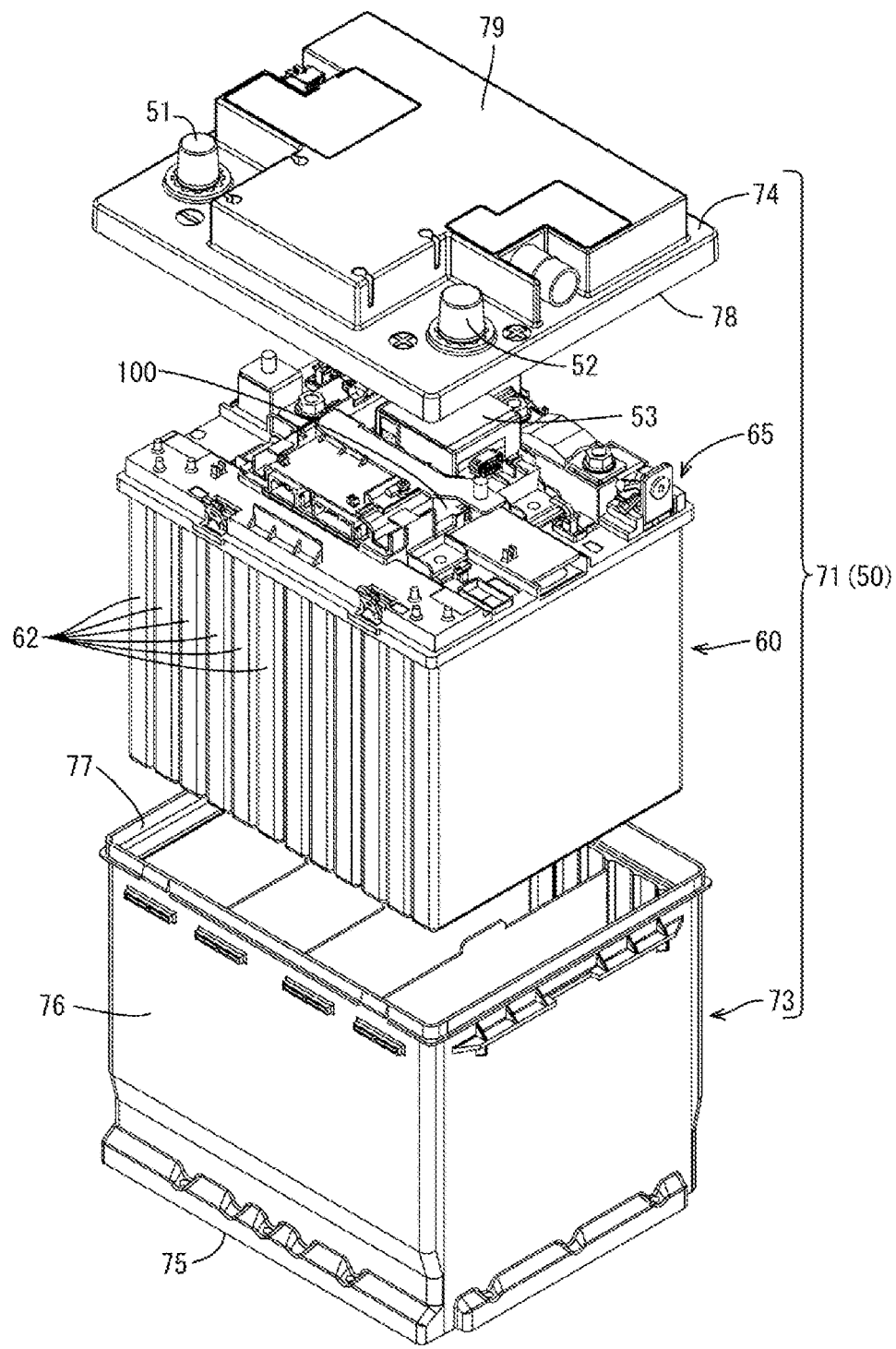
FIG. 2 is an exploded perspective view of a battery.

FIG. 1 is a side view of a vehicle, and FIG. 2 is an exploded perspective view of a battery. A vehicle 10 is an engine-driven vehicle and includes a battery 50. The battery 50 is disposed in a trunk 11 of the vehicle 10. In FIG. 1, only the vehicle 10 and the battery 50 are shown, and other parts constituting the vehicle 10 are omitted.

The battery 50 includes an assembled battery 60, a circuit board unit 65, and a housing 71. A battery is an example of an "energy storage apparatus".

As shown in FIG. 2, the housing 71 includes a body 73 made of a synthetic resin material and a lid body 74. The body 73 has a bottomed cylindrical shape. The body 73 includes a bottom surface portion 75 and four side surface portions 76. An upper opening 77 is formed in an upper-end portion by the four side surface portions 76.

The housing 71 houses the assembled battery 60 and a circuit board unit 65. The assembled battery 60 has twelve secondary batteries 62. The twelve secondary batteries 62 are connected with three in parallel and four in series. The circuit board unit 65 is disposed in the upper portion of the assembled battery 60. In the block diagram of FIG. 6, three secondary batteries 62 connected in parallel are represented by one battery symbol. The secondary battery 62 is an example of the "energy storage device".

The lid body 74 closes the upper opening 77 of the body 73. An outer peripheral wall 78 is provided around the lid body 74. The lid body 74 has a protrusion 79 in a substantially T-shape in plan view. The external terminal 51 of the positive electrode is fixed to one corner of the front portion of the lid body 74, and the external terminal 52 of the negative electrode is fixed to the other corner portion.

Figure 3:
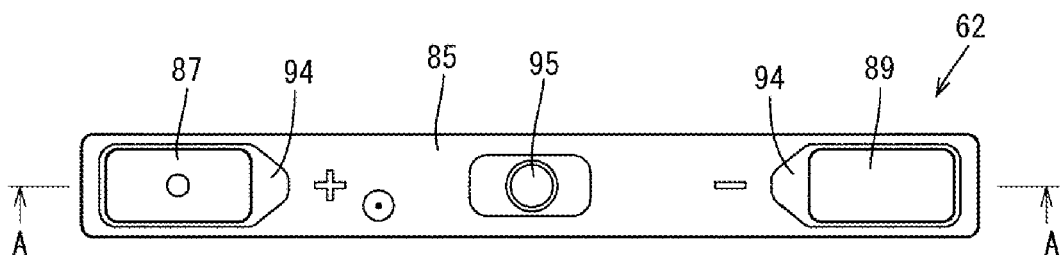
FIG. 3 is a plan view of a secondary battery.
Figure 4:
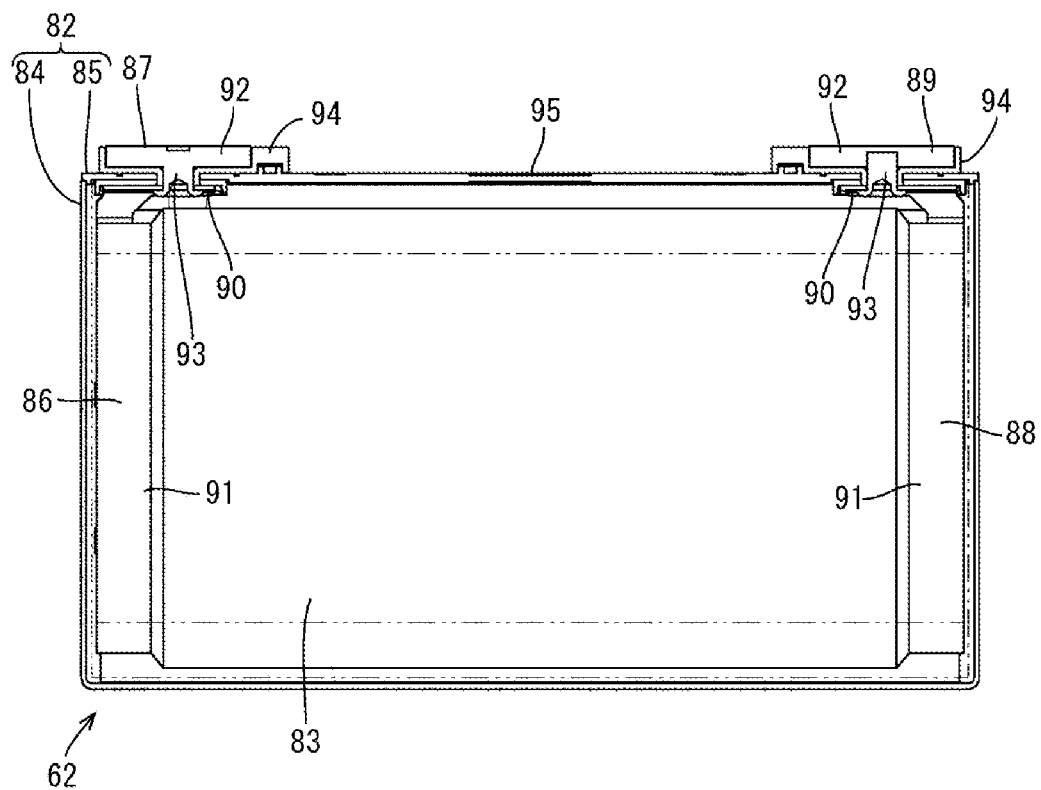
FIG. 4 is a cross-sectional view taken along line A-A in FIG. 3.

As shown in FIGS. 3 and 4, the secondary battery 62 houses an electrode assembly 83 together with a nonaqueous electrolyte in a case 82 having a rectangular parallelepiped shape. The secondary battery 62 is, for example, a lithium ion secondary battery. The case 82 has a case body 84 and a lid 85 for closing an opening at the top of the case body 84.

Although not shown in detail, the electrode assembly 83 has a separator, made of a porous resin film, disposed between a negative electrode element formed by applying an active material to a substrate made of copper foil and a positive electrode element formed by applying an active material to a substrate made of aluminum foil. These are all belt-shaped, and are wound in a flat shape so as to be able to be housed in the case body 84 in a state where the negative electrode element and the positive electrode element are displaced from each other on the opposite sides in the width direction with respect to the separator.

The positive electrode element is connected to a positive electrode terminal 87 via a positive electrode current collector 86, and the negative electrode element is connected to a negative electrode terminal 89 via a negative electrode current collector 88. Each of the positive electrode current collector 86 and the negative electrode current collector 88 is made up of a plate-shaped base 90 and legs 91 extending from the base 90. A through hole is formed in the base 90. The leg 91 is connected to the positive electrode element or the negative electrode element. Each of the positive electrode terminal 87 and the negative electrode terminal 89 is made up of a terminal body portion 92 and a shaft 93 protruding downward from the center portion of the lower surface of the terminal body portion 92. The terminal body portion 92 and the shaft 93 of the positive electrode terminal 87 are integrally formed of aluminum (single material). In the negative electrode terminal 89, the terminal body portion 92 is made of aluminum, the shaft 93 is made of copper, and these are assembled. The terminal body portions 92 of the positive electrode terminal 87 and the negative electrode terminal 89 are arranged at both ends of the lid 85 via gaskets 94 made of an insulating material and are exposed to the outside from the gaskets 94.

The lid 85 has a pressure release valve 95. As shown in FIG. 3, the pressure release valve 95 is located between the positive electrode terminal 87 and the negative electrode terminal 89. The pressure release valve 95 is opened when the internal pressure of the case 82 exceeds a limit value to lower the internal pressure of the case 82.

Figure 5:
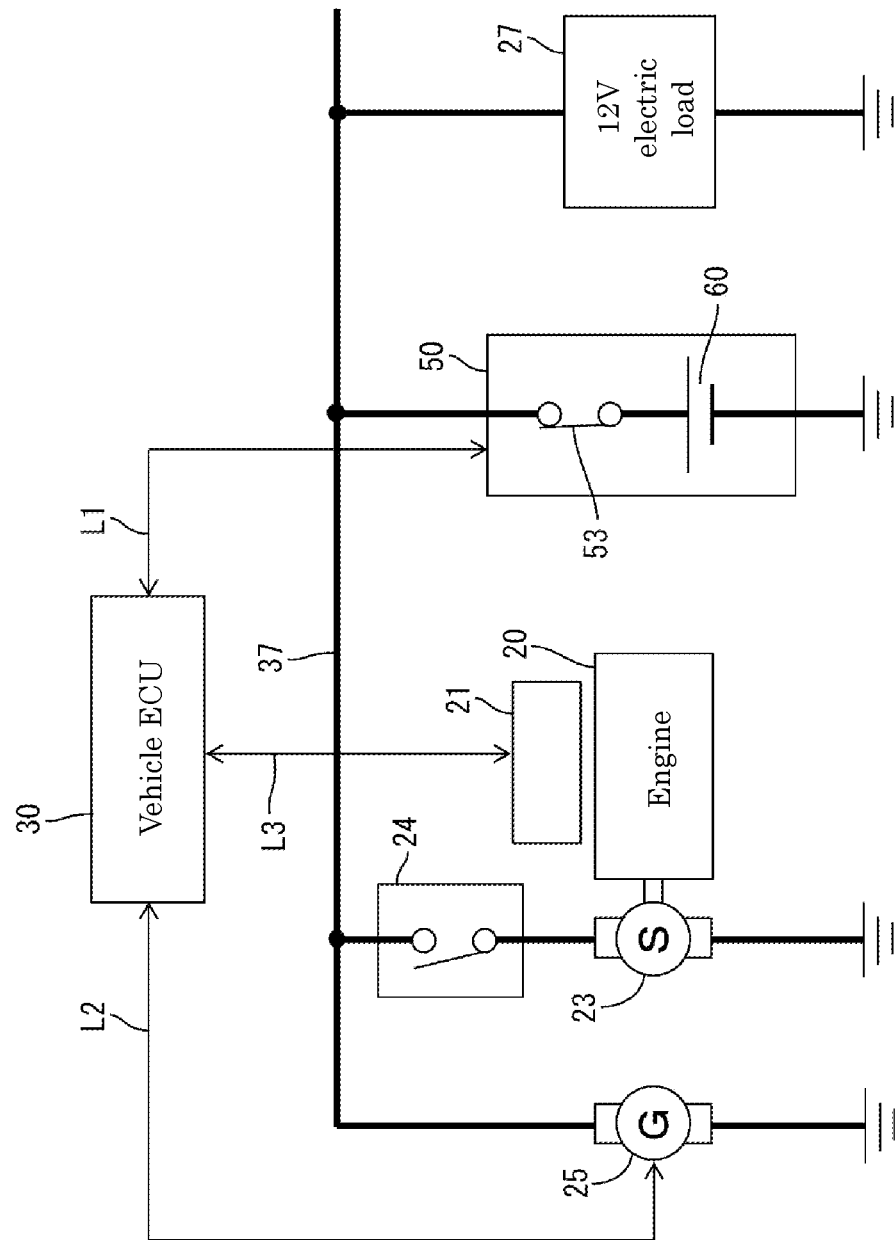
FIG. 5 is a block diagram showing an electrical configuration of the vehicle.
Figure 6:
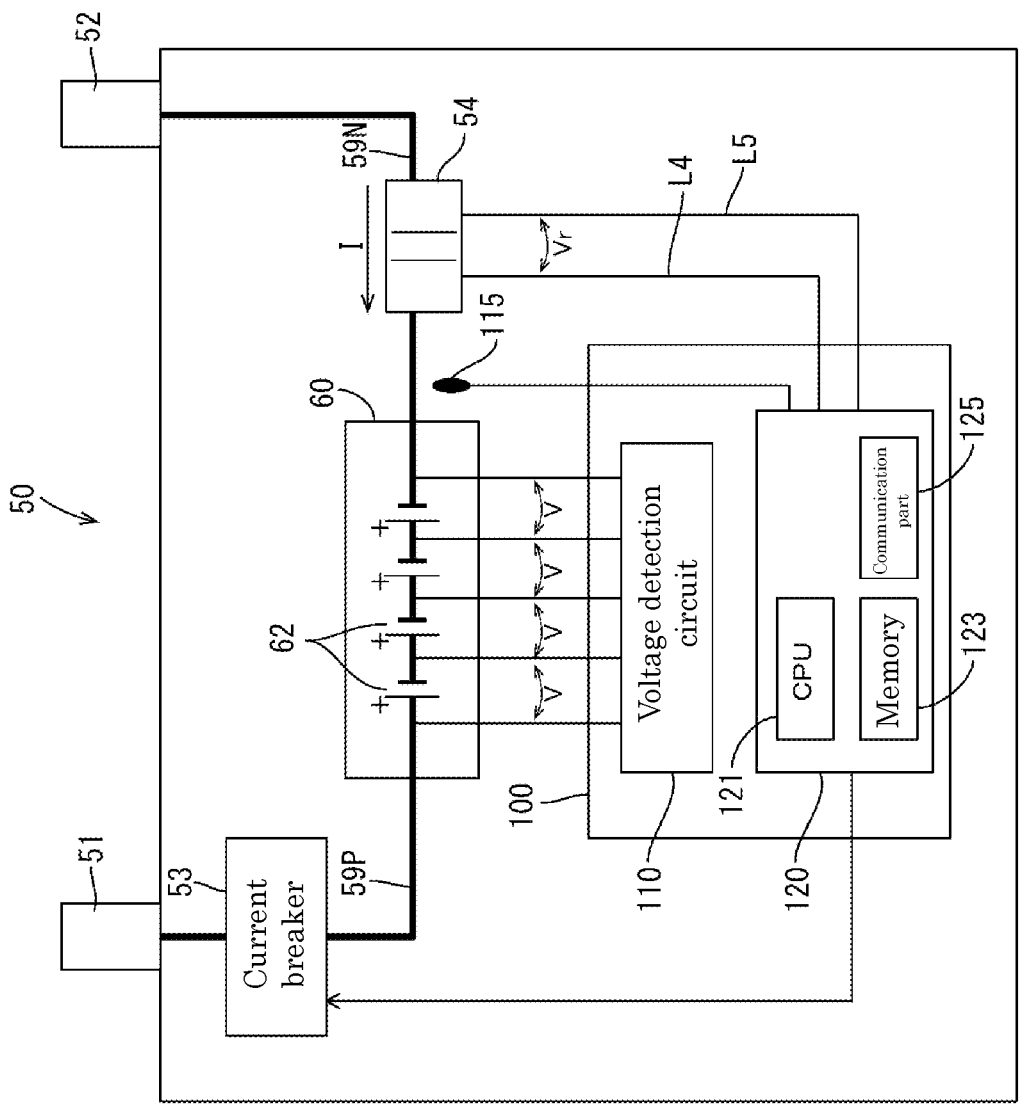
FIG. 6 is a block diagram showing an electrical configuration of the battery.

FIG. 5 is a block diagram showing the electrical configuration of the vehicle 10, and FIG. 6 is a block diagram showing the electrical configuration of the battery 50.

As shown in FIG. 5, the vehicle 10 includes an engine 20 that is a drive apparatus, an engine control part 21, an engine starter 23, an alternator 25 that is a vehicle generator, a general electric load 27, a vehicle electronic control unit (ECU) 30, a battery 50, and the like.

Battery 50 is connected to a power line 37. The engine starter 23, the alternator 25, and the general electric load 27 is connected to the battery 50 via the power line 37.

The engine starter 23 is a cell motor. When an ignition switch 24 is turned on, a cranking current flows from the battery 50 to drive the engine starter 23. By driving the engine starter 23, a crankshaft rotates to start the engine 20.

The general electric load 27 is an electric load mounted on the vehicle 10, excluding the engine starter 23. The general electric load 27 is rated at 12 V and can be exemplified by an air conditioner, audio equipment, a car navigation system, accessories, and the like.

The alternator 25 is a vehicle generator that generates power by the power of the engine 20. When the amount of power generated by the alternator 25 exceeds the amount of electric load of the vehicle 10, the alternator 25 charges the battery 50. When the amount of power generated by the alternator 25 is smaller than the amount of electric load of the vehicle 10, the battery 50 discharges to compensate for the shortage of the amount of power generated.

The vehicle ECU 30 is connected to the battery 50 so as to be able to communicate therewith via a communication line L1 and is connected to the alternator 25 so as to be able to communicate therewith via a communication line L2. The vehicle ECU 30 receives information about SOC from the battery 50 and controls the amount of power generated by the alternator 25, thereby controlling the SOC of the battery 50.

The vehicle ECU 30 is connected to the engine control part 21 so as to be able to communicate therewith via a communication line L3. The engine control part 21 is mounted on the vehicle 10 and monitors the operation state of the engine 20. The engine control part 21 monitors the traveling state of the vehicle 10 from measured values of instruments such as a speed measuring instrument. The vehicle ECU 30 can obtain, from the engine control part 21, information about turning on and off of the ignition switch 24, information about the operation state of the engine 20, and information about the traveling state (traveling, stopping traveling, stopping idling, etc.) of the vehicle 10.

As shown in FIG. 6, the battery 50 includes a current breaker 53, an assembled battery 60, a measuring resistor 54, a management apparatus 100, and a temperature sensor 115.

The current breaker 53, the assembled battery 60, and the measuring resistor 54 are connected in series via power lines 59P, 59N. The power line 59P is a power line for connecting the external terminal 51 of the positive electrode and the positive electrode of the assembled battery 60. The power line 59N is a power line for connecting the external terminal 52 of the negative electrode to the negative electrode of the assembled battery 60.

The current breaker 53 is located on the positive electrode side of the assembled battery 60 and is provided on the power line 59P of the positive electrode. The measuring resistor 54 is located on the negative electrode side of the assembled battery 60 and provided on the power line 59N of the negative electrode.

The current breaker 53 can be made of a contact switch (mechanical type) such as a relay, or a semiconductor switch such as a field-effect transistor (FET). By opening the current breaker 53, the battery 50 is disconnected from the power line 37 of the vehicle 10 to interrupt the current. By closing the current breaker 53, the battery 50 is connected to the power line 37 and comes into a state of being able to supply power to the vehicle 10. The current breaker 53 is controlled so as to be opened when there is an abnormality in the battery 50, and is configured so as to be closed at the normal time. The temperature sensor 115 measures a temperature T [° C.] of the assembled battery 60 in a contact or non-contact manner.

Figure 7:
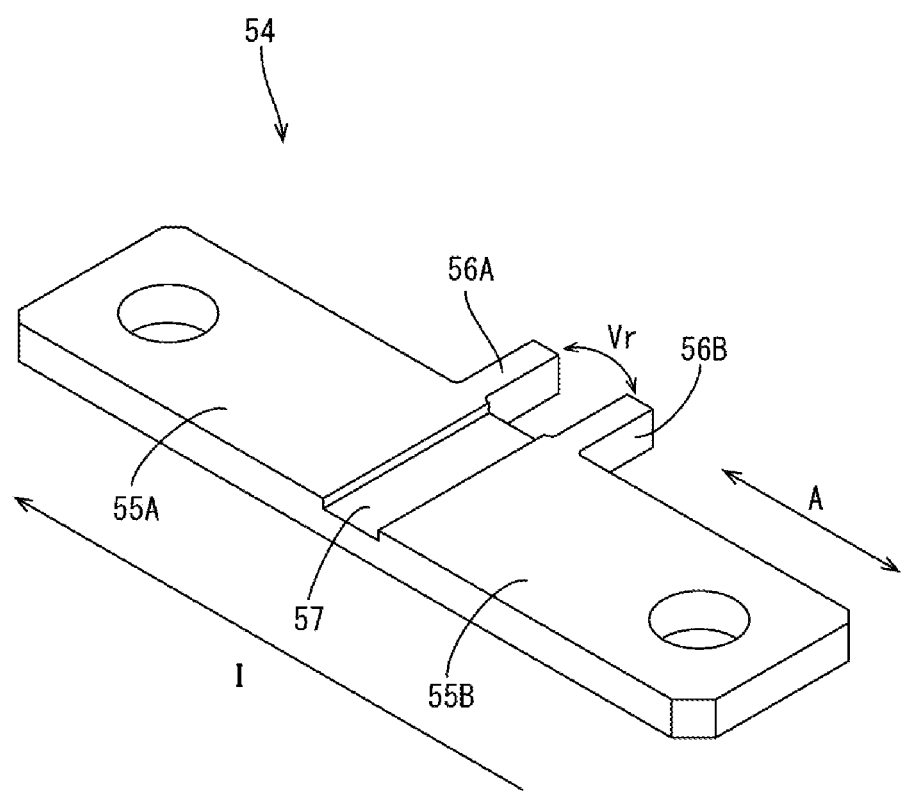
FIG. 7 is a perspective view of a measuring resistor.

As shown in FIG. 7, the measuring resistor 54 as a whole has a rectangular shape that is long in an A direction. The measuring resistor 54 includes a pair of plate portions 55A, 55B and a resistor body 57.

The pair of plate portions 55A, 55B are made of copper. The pair of plate portions 55A, 55B are located on both sides of the resistor body 57 in the A direction. The pair of plate portions 55A, 55B are connecting portions for connecting the measuring resistor 54 to connection destinations such as the assembled battery 60 and the external terminal 52.

The resistor body 57 is an alloy (for example, an alloy of copper or manganese or nickel: manganin) having a small temperature change rate of electric resistance. The resistor body 57 generates a voltage Vr proportional to a current value flowing in the measuring resistor 54.

The pair of plate portions 55A, 55B are provided with measurement terminals 56A, 56B, respectively. The two measurement terminals 56A, 56B are located near the resistor body 57. The two measurement terminals 56A, 56B are terminals for measuring the voltage Vr generated at both ends of the resistor body 57.

The management apparatus 100 is connected to the measurement terminals 56A, 56B of the measuring resistor 54 via a pair of measurement lines L4, L5. The voltage Vr generated at both ends of the resistor body 57 is detected in the management apparatus 100, so that the current I of the assembled battery 60 can be measured The management apparatus 100 is provided in the circuit board unit 65. The management apparatus 100 includes a voltage detection circuit 110 and a processing part 120. The voltage detection circuit 110 is connected to both ends of each secondary battery 62 by signal lines and measures a battery voltage V [V] of each secondary battery 62 and to total voltage VB of the assembled battery 60. The total voltage VB [V] of the assembled battery 60 is the total voltage of four secondary batteries 62 connected in series.

The processing part 120 includes a CPU 121 having an arithmetic function, a memory 123 which is a storage part, and a communication part 125.

The processing part 120 monitors the current I of the assembled battery 60, the voltage V of each secondary battery 62, and the total voltage VB and the temperature T of the assembled battery 60 from the outputs of the measuring resistor 54, the voltage detection circuit 110, and the temperature sensor 115. The processing part 120 estimates the SOC of the assembled battery 60 by a current integration method to be described later.

The processing part 120 can obtain information on the state of the vehicle 10 from the vehicle ECU 30, such as whether the vehicle 10 is parked or traveling.

The memory 123 is a non-volatile storage medium such as flash memory or an electrically erasable programmable read-only memory (EEPROM). The memory 123 stores a management program of the assembled battery 60 and data necessary for executing the management program. The management program includes a monitoring program for monitoring the current, voltage, and temperature of the assembled battery 60, and a correction program for executing correction processing for correcting a measured current value It of the assembled battery 60. The memory 123 stores each program and is also used as a working memory of the processing part 120.

2. SOC Estimation by Current Integration Method

The SOC (state of charge) is the state of charge of the battery 50. The SOC is a ratio of the residual capacity to the full charge capacity (actual capacity) and can be defined by Equation (1) below.

$$SOC\ [\%] = Cr/Co \times 100 \qquad (1)$$

Co is a full charge capacity of a secondary battery, and Cr is a residual capacity of the secondary battery.

The management apparatus 100 estimates the SOC (state of charge) of the battery 50 based on the integrated value of the current I with respect to the time measured by the measuring resistor 54, as shown by Equation (2) below. The sign of the current is plus for the time of charge and minus for the time of discharge.

$$SOC = SOCo + 100 \times (\int I dt)/Co \qquad (2)$$

SOCo is the initial value of the SOC, and I is the current.

3. Current Measurement Error Due to Temperature Difference

The measuring resistor 54 has a plate portion 55A, which is one connecting portion, connected to the assembled battery 60 and a plate portion 55B, which is the other connecting portion, connected to the external terminal 52. The temperature of the one plate portion 55A connected to the assembled battery 60 is influenced by the temperature of the assembled battery 60, and the temperature of the other plate portion 55B connected to the external terminal 52 is influenced by the temperature of the external terminal 52.

As shown in FIG. 2, the external terminal 52 projects from the upper surface of the lid body 74 and is exposed to the outside. The temperature of the external terminal 52 is substantially equal to the indoor temperature of the trunk 11 in which the battery 50 is disposed. The indoor temperature of the trunk 11 in which the battery 50 is disposed is little influenced by the state of the vehicle 10, such as parking and traveling, and is almost equal to the outside air temperature.

When there is a temperature difference between the temperature of the assembled battery 60 and the temperature of the external terminal 52, a temperature difference is generated between the two plate portions 55A, 55B, so that a temperature difference is generated at both ends of the resistor body 57.

When there is a temperature difference between both ends of the resistor body 57, a voltage is generated at both ends of the resistor body 57 by the Seebeck effect, and a measurement error occurs in a measured current value It of the measuring resistor 54.

Figure 8:
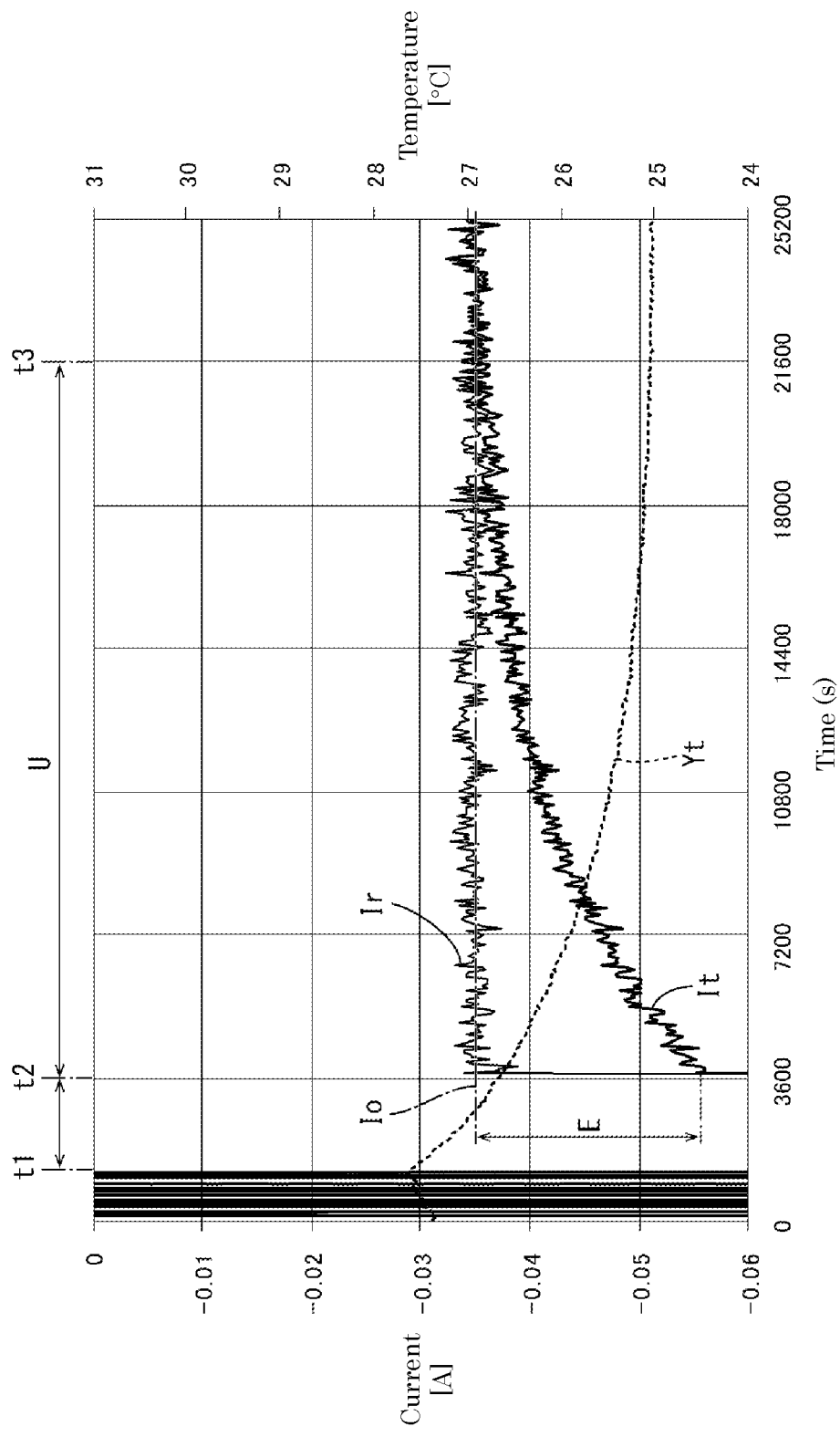
FIG. 8 is a measured current value and a temperature curve of an assembled battery after parking.

FIG. 8 is a graph of a measured current value It of the assembled battery 60 and a graph of the temperature curve Yt indicating a change in the temperature of the assembled battery 60 after the parking of the vehicle 10. The horizontal axis represents time [s], the right vertical axis represents temperature [° C.], and the left vertical axis represents current [A]. Time t1 is the parking timing, and time t2 is the timing at which a vehicle ECU 30 and the general electric load 27 mounted on the vehicle 10 stop.

After time t2, the battery 50 substantially stops charging and discharging the vehicle 10 and discharges only the dark current to the vehicle 10. The dark current is a current consumed by the vehicle 10 during parking (a current consumed by the backup memory of the vehicle ECU or a security device installed in the vehicle) and is usually a small current of 100 mA or less.

The temperature of the external terminal 52 is approximately equal to the indoor temperature of the trunk 11 and is approximately constant at the ambient temperature of 25° C.

The temperature T (temperature curve Yt) of the assembled battery 60 decreases with the lapse of time with a peak value of 27.5° C. at parking timing t1, and after time t3, the temperature becomes stable at 25° C., which is the indoor temperature of the trunk 11, and becomes equal to the temperature of the external terminal 52. That is, during the period from time t2 to time t3, the temperature of the assembled battery 60 is higher than that of the external terminal 52, and a temperature difference occurs between the temperature of the assembled battery 60 and the temperature of the external terminal 52. The reason why the temperature of the assembled battery 60 is higher than the indoor temperature of the trunk 11 at parking timing t1 is that the assembled battery 60 generates heat due to charge and discharge during the traveling of the vehicle.

Io represents the true value of the current I of the assembled battery 60 for time t2 and thereafter. Io is equal to the dark current and is constant at about −35 mA. The sign minus means discharge.

At time t2, the measured current value It is about −55 mA, which is about −20 mA higher than the true value (Io=about −35 mA) of the current. The measured current value It decreases with the lapse of time and stabilizes at about −35 mA, which is the true value, after time t3.

In period U from time t2 at which the assembled battery 60 substantially stops charging and discharging to time t3 at which the temperature T of the assembled battery 60 stabilizes at the temperature 25° C. of the external terminal 52, an error E occurs in the measured current value It with respect to a true value Io. It can thus be estimated that the error E is a measurement error due to the Seebeck effect. That is, it can be inferred that a thermal voltage has been generated caused by the temperature difference between the temperature of the assembled battery 60 and the temperature of the external terminal 52 at both ends of the resistor body 57 due to the Seebeck effect, and the measurement error E has occurred in the measured current value It measured by the measuring resistor 54.

Figure 9:
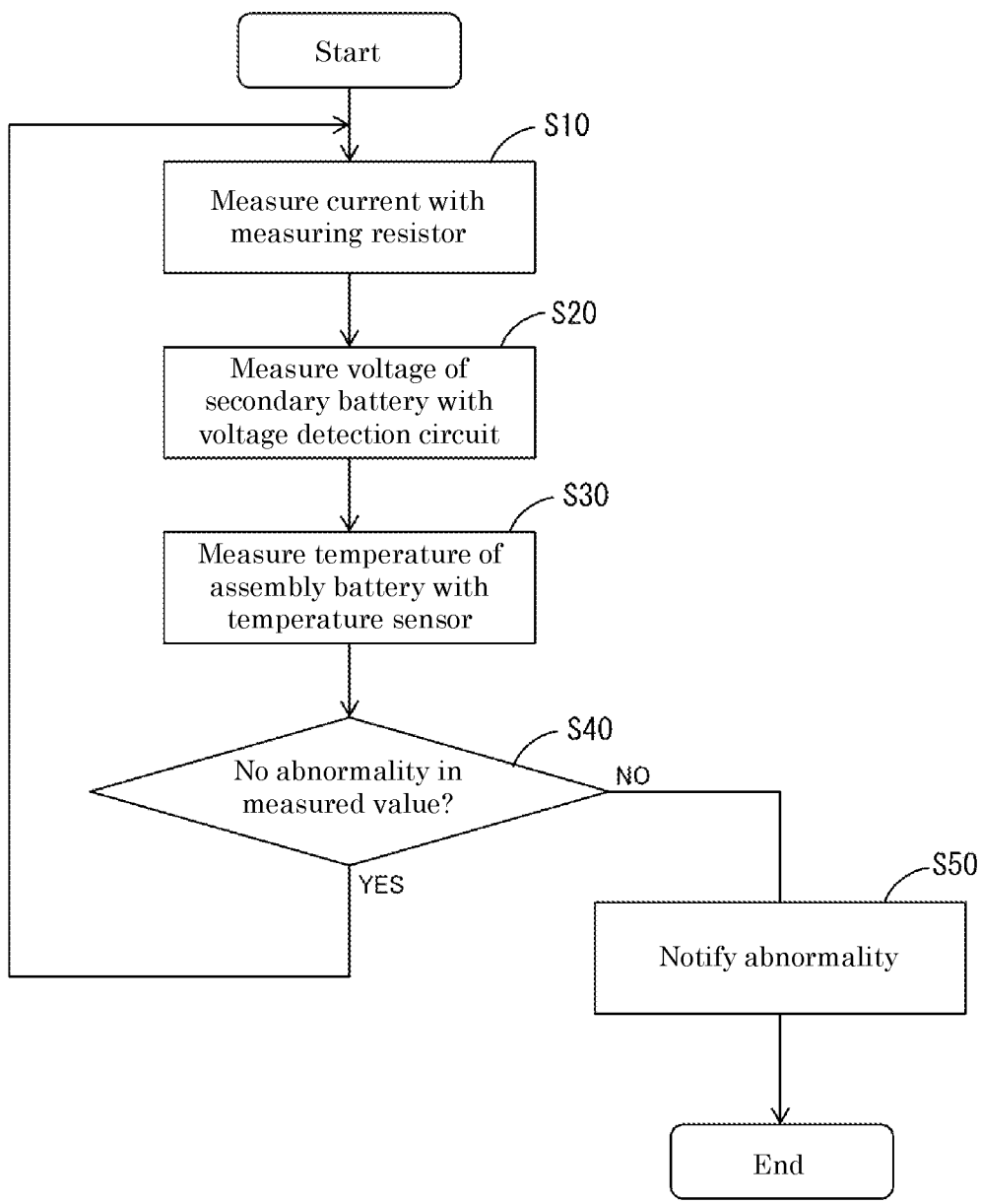
FIG. 9 is a flowchart of monitoring processing.

FIG. 9 is a flowchart of the monitoring processing of the battery 50. The monitoring processing of the battery 50 is always executed at a predetermined measurement cycle N during the activation of the management apparatus 100 regardless of the state of the vehicle 10.

The monitoring processing of the battery 50 is made up of S10 to S50. When the monitoring processing starts, the processing part 120 measures the current I of the assembled battery 60 by using the measuring resistor 54 (S10). The processing part 120 measures the voltage V of each secondary battery 62 by using the voltage detection circuit 110 and measures the temperature T of the assembled battery 60 by using the temperature sensor 115 (S20, S30).

Thereafter, the processing part 120 temporarily stores each measured value into the memory 123 and performs processing for determining whether the measured value is abnormal (S40).

When there is no abnormality in the measured value (S40: YES), each of the processing S10 to S30 is repeatedly performed at the predetermined measurement cycle N. When there is an abnormality in the measured value (S40: NO), the processing part 120 performs processing for notifying the abnormality to the vehicle ECU 30.

Figure 10:
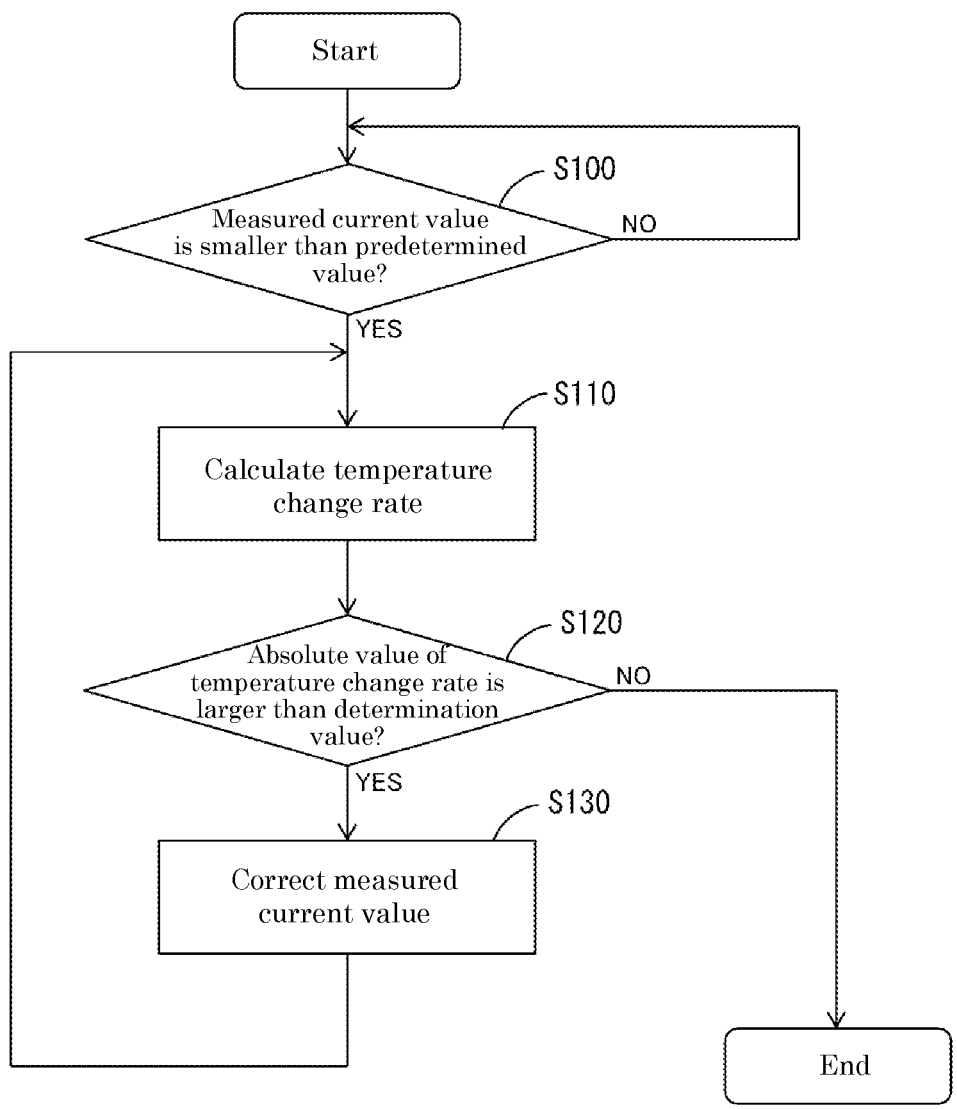
FIG. 10 is a flowchart of current correction processing.

FIG. 10 is a flowchart of current correction processing executed after the parking of the vehicle 10. The current correction processing is made up of 4 steps of S100 to S130.

When receiving information from the vehicle ECU 30 by communication that the vehicle 10 is parked, the processing part 120 performs processing for comparing the measured current value It of the assembled battery 60 with a predetermined value (S100). The predetermined value is a value for determining that the assembled battery 60 has stopped charging and discharging and is, for example, 100 mA.

When the measured current value It of the assembled battery 60 is smaller than the predetermined value (YES in S100), the processing part 120 calculates a temperature change rate X from the data of the temperature T of the assembled battery 60 measured by the monitoring processing (S110). The temperature change rate X is a change amount ΔT of the temperature T with respect to a time change Δt and is the slope of the temperature curve Yt shown in FIG. 8.

$$X = \Delta T / \Delta t \quad (3)$$

When calculating the temperature change rate X, the processing part 120 performs processing for comparing the absolute value of the temperature change rate X with a determination value (S120). The determination value is a value for determining whether or not the change in the temperature of the assembled battery 60 has converged, and is, for example, 0.005° C./sec.

When the absolute value of the temperature change rate X is larger than the determination value (S120: YES), the processing part 120 calculates a correction value R of the measured current value It based on the temperature change rate X.

The temperature change rate X is the slope of the temperature curve Yt shown in FIG. 8 and is higher as the temperature of the assembled battery 60 is higher and the temperature difference from the external terminal 52 is larger. Since it is considered that the temperature change rate X has a high correlation with the temperature difference between the assembled battery 60 and the external terminal 52, the correction value R for correcting the measurement error of the measured current value It caused by the temperature difference can be calculated by using the temperature change rate X.

The processing part 120 calculates the correction value R from Equation (4) below based on the temperature change rate X and performs correction processing for correcting the measured current value It of the assembled battery 60 (S130).

$$R = |K \times (\Delta T / \Delta t)| \qquad (4)$$

$$Ir = It \pm R \qquad (5)$$

Ir is a corrected current value, It is a measured current value, K is a correction coefficient, and R is a correction value.

When the temperature T of the assembled battery 60 is higher than the temperature of the external terminal 52, as shown in FIG. 8, the measured current value It has a larger current value (absolute value of current) than the true value Io. Thus, in the correction processing, a value close to the true value Io can be obtained by performing correction so that the current value becomes small. In this case, with the measured current value It being a negative value in discharge, correction, which is to add the correction value R, is performed to reduce the current value, so that the measurement error can be corrected.

When the absolute value of the temperature change rate X is smaller than the predetermined value, each of the processing S110 to S130 is performed at the predetermined measurement cycle N, and the measured current value It at each time point is corrected.

In the example of FIG. 8, the processing part 120 calculates the correction value R based on the current change rate X at each time point from time t2 to time t3 and corrects the measured current value It. The corrected current value Ir substantially overlaps the true value Io, and the measurement error is smaller than that before correction.

When the absolute value of the temperature change rate X is smaller than the determination value (S120: NO), the processing part 120 ends the correction processing of the measured current value It. In the example of FIG. 8, the processing part 120 ends the correction processing of the measured current value It at time t3 when the absolute value of the temperature change rate X becomes smaller than the determination value.

6. Effect

As a result of intensive studies on improving the current measurement accuracy and the SOC estimation accuracy of the assembled battery 60, the inventors have found that a current measurement error may occur depending on a temperature difference between the temperature of the assembled battery 60 and the temperature of the external terminal 52.

The management apparatus 100 obtains the correction value R from the temperature change rate X of the assembled battery 60 and corrects the current measurement error caused by the temperature difference between the temperature of the assembled battery 60 and the temperature of the external terminal 52. It is thereby possible to suppress the measurement error of the measured current value It caused by the temperature difference between the temperature of the assembled battery 60 and the temperature of the external terminal 52, for which no countermeasure has been taken so far. The SOC estimation accuracy can be improved by integrating the corrected measured current value to estimating the SOC.

The current measurement error caused by the temperature difference between the temperature of the assembled battery 60 and the temperature of the external terminal 52 has a larger influence as the measured current value It is smaller when the temperature difference is the same. That is, the ratio of the measurement error to the measured current value It increases, thus causing a decrease in current measurement accuracy. Since the management apparatus 100 executes the correction processing when the measured current value It of the assembled battery 60 is smaller than a predetermined value, the current measurement accuracy can be improved.

The temperature monitoring of the assembled battery 60 is one of the monitoring functions of the battery 50. The temperature change rate X of the assembled battery 60 can be obtained from the measured temperature value of the assembled battery 60. Since the management apparatus 100 performs correction based on the temperature change rate X of the assembled battery 60, the measured current value It can be corrected using the normal monitoring function of the battery 50 without adding a new sensor.

Second Embodiment

Figure 11:
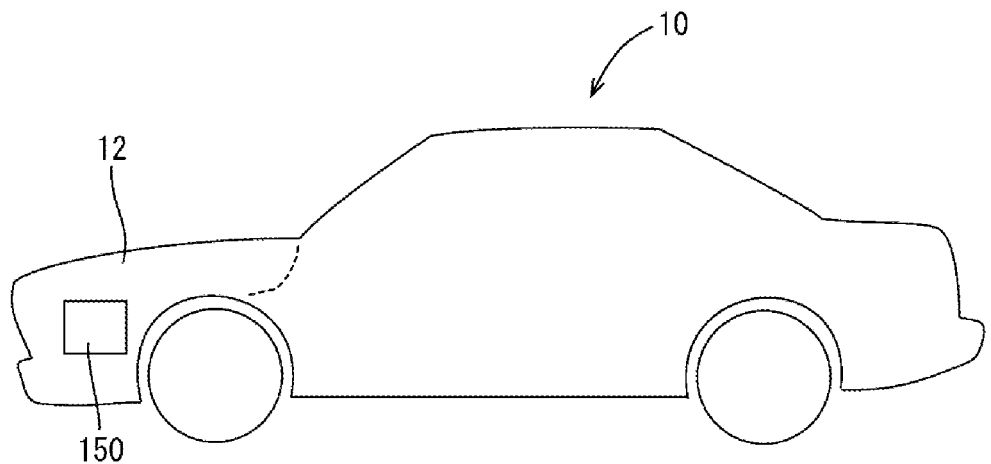
FIG. 11 is a side view of a vehicle according to the second embodiment.

In the first embodiment, the battery 50 has been disposed in the trunk 11. In the second embodiment, a description will be given of an example in which the battery 150 is disposed in an engine compartment 12, as shown in FIG. 11.

Figure 12:
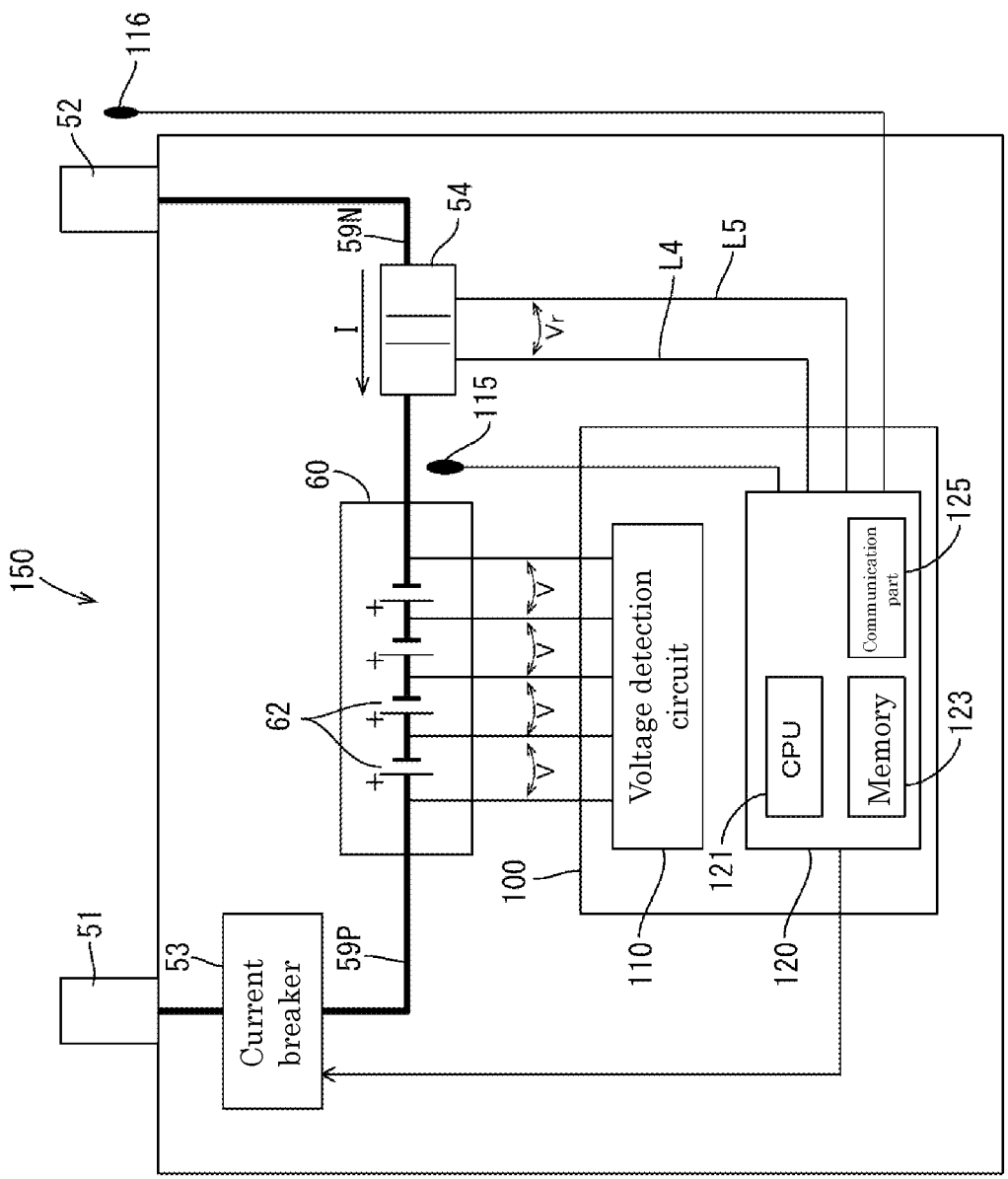
FIG. 12 is a block diagram showing an electrical configuration of a battery.

In the second embodiment, as shown in FIG. 12, the battery 150 includes the temperature sensor 115 for detecting the temperature T1 of the assembled battery 60 and a temperature sensor 116 for detecting the temperature of the external terminal 52.

The temperature sensor 116 measures the ambient temperature of the external terminal 52. The temperature of the external terminal 52 is substantially equal to the ambient temperature, and hence the ambient temperature of the external terminal 52 can be regarded as the temperature of the external terminal 52. The temperature sensor 116 may directly measure the temperature of the external terminal 52.

After the parking of the vehicle 10, the processing part 120 detects a temperature difference (T2−T1) between the temperature of the assembled battery 150 and the external terminal 52 from the detected values of the two temperature sensors 115, 116. When the temperature difference (T2−T1) is equal to or larger than a predetermined value after the parking of the vehicle 10, the processing part 120 obtains the correction value R from the temperature difference (T2−T1) and corrects the measured current value It measured by the measuring resistor 54.

$$R = K \times (T2 - T1) \qquad (6)$$

K is a correction coefficient, T1 is the temperature of the assembled battery, and T2 is the temperature of the external terminal.

Figure 13:
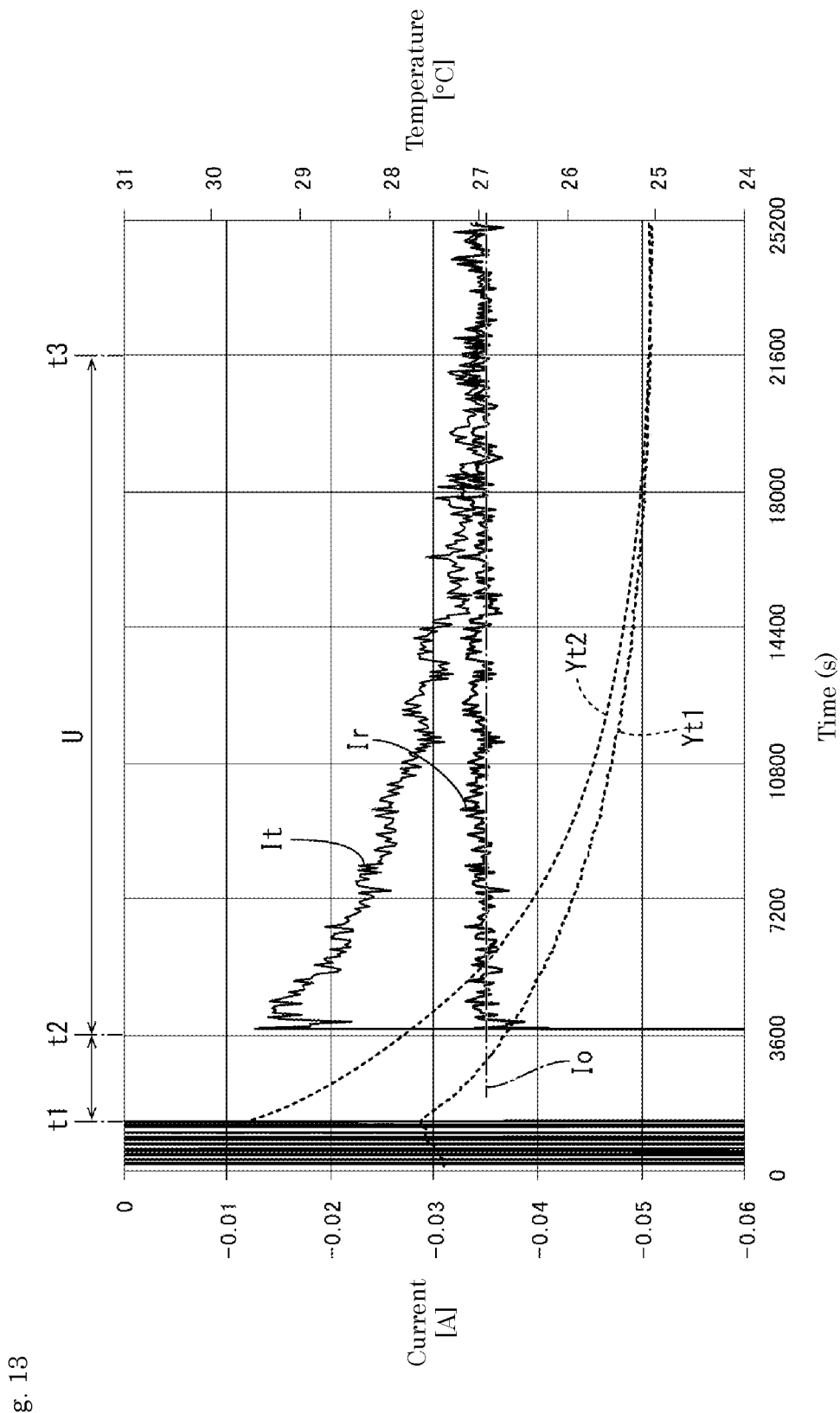
FIG. 13 is a measured current value of an assembled battery after parking and temperature curves of the assembled battery and an engine compartment.

FIG. 13 shows waveforms It, Ir, Yt1, and Yt2 after the parking of the vehicle. It is the measured current value of the assembled battery 60, and Ir is a corrected current value. Yt1 is a temperature curve indicating a change in the temperature of the assembled battery 60, and Yt2 is a temperature curve of the external terminal 52.

The engine compartment 12 houses an engine as a heat source and thus becomes hot during the traveling of the vehicle. With the battery 150 being disposed in the engine compartment 12, the external terminal 52 becomes hot under the influence of the indoor temperature of the engine compartment 12 during the traveling of the vehicle. In the example of FIG. 12, at parking timing t1 of the vehicle, the temperature of the external terminal 52 is higher than the temperature of the assembled battery 60.

Since the magnitude relationship between the temperature of the assembled battery 60 and the temperature of the external terminal 52 is reversed from that of the first embodiment, the measurement error of the measured current value It is in the inverse relationship to that of the first embodiment, and the measured current value It has a smaller current value (absolute value of current) than the true value Io. Thus, in the correction processing, a value close to the true value Io can be obtained by performing correction so that the current value becomes large. In this case, with the measured current value It being a negative value in discharge, correction, which is to subtract the correction value R, is performed to increase the current value, so that the measurement error can be corrected.

In the second embodiment, since the temperature difference between the assembled battery 60 and the external terminal 52 can be accurately detected, a highly accurate correction can be performed.

Third Embodiment

In the first embodiment, the processing part 120 has obtained the correction value R at each time point by using the temperature change rate X of the assembled battery 60 and corrected the measured current value It detected by the measuring resistor 54 for period U from time t2 to time t3 after the parking of the vehicle 10.

In the third embodiment, the processing part 120 corrects the measured current value It detected by the measuring resistor 54 by using a correction value W stored in the memory or the like for period U from time t2 to time t3 after the parking of the vehicle 10. As the correction value W, the measurement error of the measured current value It by the measuring resistor 54 is experimentally obtained for period U from time t2 to time t3, and the average value thereof, or the like, can be used.

Even in a case where the correction value R is not obtained by calculation and is set to a fixed value, when the temperature difference between the temperature of the assembled battery 60 and the temperature of the external terminal 52 is not significantly different from that at the time of experiment after parking, a highly accurate correction can be performed.

Fourth Embodiment

In the first embodiment, the processing part 120 has obtained the correction value R at each time point by using the temperature change rate X of the assembled battery 60 and corrected the measured current value It measured by the measuring resistor 54 for period U from time t2 to time t3 after the parking of the vehicle 10.

Since the SOC is calculated by integrating the measured current value It, when there is a temperature difference between the temperature of the assembled battery 60 and the temperature of the external terminal 52, the measurement error caused by the temperature difference is integrated, and an estimation error is generated in the SOC.

Therefore, the processing part 120 obtains the correction value R of the measured current value It based on the temperature change rate X of the assembled battery 60 for each time point from time t2 to time t3 after the parking of the vehicle 10, and further obtains an integrated correction value ∫Rdt. Then, after time t3 at which the temperature of the assembled battery 10 becomes stable, the SOC is corrected by the calculated integrated correction value ∫Rdt. It is thereby possible to correct the estimation error of the SOC.

$$SOCr = SOCt \pm \int Rdt \quad (7)$$

SOCr is the corrected SOC, and SOCt is the SOC calculated from the uncorrected measured current value.

In the first embodiment, the processing part 120 has corrected the measured current value at each time point from time t2 to time t3. The fourth embodiment is different in that the correction processing is performed on the SOC after the temperature of the assembled battery 60 becomes stable without performing the real-time correction on the measured current value.

Other Embodiments

The present invention is not restricted to the embodiments described above and the drawings, but, for example, the following embodiments are included in the technical scope of the present invention.

(1) In the above first to fourth embodiments, the secondary battery 62 has been exemplified as an example of the energy storage device. The energy storage device is not limited to the secondary battery 62 but may be a capacitor. The secondary battery 62 is not limited to a lithium ion secondary battery but may be another nonaqueous electrolyte secondary battery. A lead-acid battery or the like can also be used. The energy storage device is not limited to a case where a plurality of energy storage devices are connected in series but may be connected in series or may have a single cell structure.

(2) In the above first to fourth embodiments, the management apparatus 100 has been provided inside the battery 50. The battery 50 may have at least the assembled battery 60 and measuring instruments, and the management apparatus 100 may be provided outside the battery 50. In the first to fourth embodiments, the measuring resistor 54 has been disposed on the negative electrode side of the assembled battery 60 but may be disposed on the positive electrode side.

(3) In the above first to fourth embodiments, the correction processing has been performed on the measured current value in the case where the measured current value is smaller than the predetermined value after the parking of the vehicle. When there is a temperature difference between the temperature of the assembled battery and the temperature of the external terminal, the correction processing for the measured current value may be performed in a case where the current measurement is larger than a predetermined value while the vehicle is traveling. That is, when there is a temperature difference between the temperature of the assembled battery and the temperature of the external terminal, the measured current value always includes a measurement error due to the Seebeck effect, so that the correction processing may be performed regardless of the size of the measured current value or the state of the vehicle.

(4) In the above first to fourth embodiments, the battery 50 has been used for a vehicle. The use of the battery 50 is not limited to a specific use. The battery 50 can be used for various uses such as a use for a moving body (a vehicle, a ship, an automatic guided vehicle (AGV), etc.) and a stationary use (an energy storage apparatus for an uninterruptible power supply system or a photovoltaic power generation system).

(5) In the first embodiment, the corrected measured current value has been used in the function of estimating the SOC by integrating the measured current values, thereby improving the SOC estimation accuracy. However, in addition to the SOC estimation function, it is possible to avoid an erroneous operation by using the corrected measured current value for Functions 1 and 2 shown below.

Function 1. A function of shifting the mode from the second mode to the first mode when a current value equal to or larger than a predetermined measured current value is measured in the current measurement processing Function 2. A function of determining a vehicle failure when a current value equal to or larger than a predetermined measured current value is measured in the current measurement processing In both Functions 1 and 2, when the temperature difference between the temperature of the energy storage device and the temperature of the external terminal is large, it is determined that a voltage is generated at both ends of the measuring resistor by the Seebeck effect, and it is determined in the current measurement processing that a current is flowing.

In Function 1, when the current value equal to or larger than the predetermined measured current value is measured, the mode is shifted from the second mode to the first mode, so that the power consumption increases. When the vehicle is parked and the engine is stopped, the battery is not charged, and the battery may be exhausted. Therefore, by using the corrected measured current value, it is possible to avoid the mode from being shifted from the second mode to the first mode and to prevent the battery from running out.

In Function 2, since a vehicle failure is determined when the current value equal to or larger than the predetermined measured current value is measured, a vehicle failure diagnosis may be performed unexpectedly. Therefore, by using the corrected measured current value, unexpected execution of the vehicle failure diagnosis can be avoided.

(6) In the second embodiment, since not only the temperature of the assembled battery 60 but also the temperature of the external terminal 52 changes after parking, the temperatures of both the assembled battery 60 and the external terminal 52 have been measured to obtain a temperature difference, and the correction value of the measured current value It has been obtained from the obtained temperature difference. In addition to this, when the change in the temperature of the assembled battery 60 after the parking of the vehicle can be predicted from the use history of the assembled battery 60, the temperature difference between the temperature of the assembled battery 60 and the temperature of the external terminal 52 can be predicted by measuring only the temperature of the external terminal 52, and the correction value of the measured current value caused by the temperature difference may be obtained from the predicted value.

(7) In the second embodiment, since not only the temperature of the assembled battery 60 but also the temperature of the external terminal 52 changes after parking, the temperatures of both the assembled battery 60 and the external terminal 52 have been measured to obtain a temperature difference, and the correction value of the measured current value It has been obtained from the obtained temperature difference. Even when both the assembled battery 60 and the external terminal 52 change in temperature after the parking of the vehicle 10, a temperature difference is still generated during a period in which the temperature change rate X of the assembled battery 60 is equal to or larger than the determination value, so that the correction value R may be obtained from the temperature change rate X of the assembled battery 60 to correct the measured temperature value It of the assembled battery 60, as in the first embodiment.

(8) The present technique can be applied to a management program for an energy storage device. A management program for an energy storage device is a program for causing a computer to execute: current measurement processing for measuring a current of the energy storage device by using a measuring resistor having one side connected to the energy storage device and the other side connected to an external terminal; temperature measurement processing for measuring at least one of a temperature of the energy storage device and a temperature of the external terminal; and correction processing for correcting, when there is a temperature difference between the temperature of the energy storage device and the temperature of the external terminal, a measurement error caused by the temperature difference for a measured current value measured by the current measurement processing, or correction processing for correcting an estimation error caused by the temperature difference for an SOC of the energy storage device. The present technique can be applied to a recording medium in which the management program for the energy storage device is recorded. The computer is, for example, the processing part 120 of the management apparatus 100.

DESCRIPTION OF REFERENCE SIGNS

10: automobile
50: battery
53: current breaker
54: measuring resistor
57: resistor body
60: assembled battery
62: secondary battery (energy storage device)
100: management apparatus
120: processing part
123: memory

The invention claimed is:
1. A management apparatus for an energy storage device, the management apparatus comprising:
 a processor; and
 a memory, the memory storing instructions to cause the processor to perform:
  current measurement processing for measuring a current of the energy storage device by using a measuring resistor having one side connected to the energy storage device and the other side connected to an external terminal,
  temperature measurement processing for measuring at least one of a temperature of the energy storage device and a temperature of the external terminal, and
  correction processing for correcting, when there is a temperature difference between the temperature of the energy storage device and the temperature of the external terminal, a measurement error caused by the temperature difference for a measured current value measured by the current measurement processing, or guarantee processing for guaranteeing a function to be performed in accordance with a measured current value measured by the current measurement processing.

2. The management apparatus according to claim 1, wherein
the function comprises a function of integrating the measured current value to calculate a state of charge (SOC) of the energy storage device, and
the guarantee processing comprises processing for correcting an estimation error caused by the temperature difference for the SOC of the energy storage device.

3. The management apparatus according to claim 2, wherein the correction processing is executed when the measured current value of the energy storage device is smaller than a predetermined value.

4. The management apparatus according to claim 1, wherein
the current measurement processing includes a first mode for measuring the measured current value at a predetermined cycle, and a second mode for measuring the measured current value at a cycle longer than the predetermined cycle,
the function comprises a function of transferring the mode from the second mode to the first mode when the current measurement processing measures a current value equal to or larger than a predetermined measured current value, and
the guarantee processing comprises processing for correcting a measurement error caused by the temperature difference for the measured current value to avoid mode transfer due to a measurement error.

5. The management apparatus according to claim 1, wherein
the function comprises a function of diagnosing a vehicle failure when a current value equal to or larger than a predetermined current value is measured in the current measurement processing, and
the guarantee processing comprises processing for correcting a measurement error caused by the temperature difference for the measured current value to avoid misdiagnosis of the vehicle failure due to the measurement error.

6. The management apparatus for an energy storage device according to claim 1, wherein
based on a measured temperature value measured by the temperature measurement processing, calculation processing is performed for calculating a correction value for correcting the measurement error of the measured current value caused by the temperature difference between the temperature of the energy storage device and the temperature of the external terminal, or a correction value for correcting the estimation error of the SOC, and
in the correction processing, the measured current value is corrected based on the correction value, or the SOC is corrected based on the correction value.

7. The management apparatus according to claim 6, wherein
in the temperature measurement processing, the temperature of the energy storage device is measured, and
in the calculation processing, the correction value of the measured current value or the correction value of the SOC is calculated based on a temperature change rate of the energy storage device.

8. A vehicle comprising:
a management apparatus for an energy storage device, wherein the management apparatus includes:
a processor; and
a memory, the memory storing instructions to cause the processor to perform:
current measurement processing for measuring a current of the energy storage device by using a measuring resistor having one side connected to the energy storage device and the other side connected to an external terminal,
temperature measurement processing for measuring at least one of a temperature of the energy storage device and a temperature of the external terminal, and
correction processing for correcting, when there is a temperature difference between the temperature of the energy storage device and the temperature of the external terminal, a measurement error caused by the temperature difference for a measured current value measured by the current measurement processing, or guarantee processing for guaranteeing a function to be performed in accordance with a measured current value measured by the current measurement processing.

9. A management method for an energy storage device, the method comprising:
current measurement processing for measuring a current of the energy storage device by using a measuring resistor having one side connected to the energy storage device and the other side connected to an external terminal;
temperature measurement processing for measuring at least one temperature of a temperature of the energy storage device and a temperature of the external terminal; and
correction processing for correcting, when there is a temperature difference between the temperature of the energy storage device and the temperature of the external terminal, a measurement error caused by the temperature difference for a measured current value measured by the current measurement processing, or correction processing for correcting an estimation error caused by the temperature difference for an SOC of the energy storage device.

* * * * *